(12) United States Patent
Lee et al.

(10) Patent No.: US 12,243,767 B2
(45) Date of Patent: Mar. 4, 2025

(54) SUBSTRATE SUPPORT ASSEMBLY AND SUBSTRATE PROCESSING APPARATUS

(71) Applicant: EUGENE TECHNOLOGY CO., LTD., Yongin-si (KR)

(72) Inventors: Sang Don Lee, Yongin-si (KR); Yong Ki Kim, Hwaseong-si (KR); Yang Sik Shin, Yongin-si (KR); Sung Gyun Son, Suwon-si (KR); Jae Woo Kim, Yongin-si (KR)

(73) Assignee: EUGENE TECHNOLOGY CO., LTD., Yongin-si (KR)

( * ) Notice: Subject to any disclaimer, the term of this patent is extended or adjusted under 35 U.S.C. 154(b) by 358 days.

(21) Appl. No.: 17/635,920

(22) PCT Filed: Jul. 24, 2020

(86) PCT No.: PCT/KR2020/009804
§ 371 (c)(1),
(2) Date: Feb. 16, 2022

(87) PCT Pub. No.: WO2021/033934
PCT Pub. Date: Feb. 25, 2021

(65) Prior Publication Data
US 2022/0336259 A1    Oct. 20, 2022

(30) Foreign Application Priority Data
Aug. 19, 2019 (KR) .................. 10-2019-0100882

(51) Int. Cl.
*H01L 21/687* (2006.01)
(52) U.S. Cl.
CPC .................. *H01L 21/68742* (2013.01)

(58) Field of Classification Search
CPC .................. H01L 21/68742; H01L 21/68785
See application file for complete search history.

(56) References Cited

U.S. PATENT DOCUMENTS

| 8,003,920 B2* | 8/2011 | Hayashi | ............ H01L 21/68742 |
| | | | 219/390 |
| 10,892,180 B2* | 1/2021 | Chia | .................. H01L 21/68742 |

(Continued)

FOREIGN PATENT DOCUMENTS

| JP | 2000-260854 A | 9/2000 |
| JP | 2007-242954 A | 9/2007 |
| JP | 2008-187102 A | 8/2008 |

*Primary Examiner* — Seahee Hong
(74) *Attorney, Agent, or Firm* — Rabin & Berdo, P.C.

(57) ABSTRACT

In accordance with an exemplary embodiment of the present invention, an assembly for supporting substrate, the assembly comprising: a support frame having at least one insertion hole recessed from one surface of the support frame, the insertion hole having an inner movement hole and a screw hole positioned outside the inner movement hole; and a substrate support member including a shaft body inserted into the insertion hole with one end of the shaft body and a pin shaft connected to the shaft body to support the substrate in contact, wherein the shaft body having an inner screw body inserted into the insertion hole and positioned in the inner movement hole and a connection body disposed between the inner screw body and the pin shaft and positioned in the screw hole, wherein the inner diameter of the screw hole is smaller than the diameter of the inner movement hole and the outer diameter of the inner screw body, the inner screw body is capable of passing through the screw hole by rotation.

8 Claims, 4 Drawing Sheets

(56) References Cited

U.S. PATENT DOCUMENTS

| | | | | |
|---|---|---|---|---|
| 2004/0051220 A1* | 3/2004 | Hunger | ............ | H01L 21/68742 269/13 |
| 2007/0212200 A1* | 9/2007 | Ueda | ................ | H01L 21/68742 414/217 |
| 2007/0240646 A1* | 10/2007 | Jun | .................. | H01L 21/68742 118/729 |
| 2009/0314211 A1* | 12/2009 | Du Bois | .......... | H01L 21/68742 118/729 |
| 2019/0214290 A1* | 7/2019 | Marcelynas | ...... | H01L 21/68742 |

* cited by examiner

SUBSTRATE SUPPORT ASSEMBLY AND SUBSTRATE PROCESSING APPARATUS

TECHNICAL FIELD

The present invention relates to a substrate supporting assembly and a substrate processing apparatus and, more particularly, to a substrate supporting assembly and a substrate processing apparatus capable of stably supporting a substrate.

BACKGROUND ART

Many electronic products contain microscopic electronic devices, and in order to form such devices, numerous substrate supporting apparatus such as etching equipment and thin film forming equipment are used. For example, in the case of a semiconductor device, numerous devices are formed on a circular wafer, and in the case of a flat panel display, electronic devices such as a number of transistors, capacitors, and resistors are integrated on a rectangular glass substrate.

In relation to a substrate processing apparatus, a circular wafer or a square glass substrate is placed on a substrate support and supported by the substrate support, and then the process is performed. The processed substrate is lifted by a lift pin, and transferred by a transfer robot to another substrate processing apparatus for the next process.

On the other hand, the lift pin is fastened and fixed to the base, but the lift pin is released from the base due to the lifting of the substrate support or the lifting of the base, which causes the lift pin to be separated from the base. Also, due to the different height of the lift pins, the substrate is skewed in one direction, in severe case, falls to be damaged.

DISCLOSURE OF THE INVENTION

Technical Problem

The present invention provides to a substrate supporting assembly and a substrate processing apparatus capable of stably supporting a substrate.

Another object of the present invention is to provide a substrate support assembly and a substrate processing apparatus capable of preventing a lift pin or a substrate support member from being separated from a base.

Further another object of the present invention will become evident with reference to following detailed descriptions and drawings.

Technical Solution

In accordance with an exemplary embodiment of the present invention, an assembly for supporting substrate, the assembly comprising: a support frame having at least one insertion hole recessed from one surface of the support frame, the insertion hole having an inner movement hole and a screw hole positioned outside the inner movement hole; and a substrate support member including a shaft body inserted into the insertion hole with one end of the shaft body and a pin shaft connected to the shaft body to support the substrate in contact, wherein the shaft body having an inner screw body inserted into the insertion hole and positioned in the inner movement hole and a connection body disposed between the inner screw body and the pin shaft and positioned in the screw hole, wherein the inner diameter of the screw hole is smaller than the diameter of the inner movement hole and the outer diameter of the inner screw body, the inner screw body is capable of passing through the screw hole by rotation.

The support frame may further have an outer movement hole positioned outside the screw hole, the shaft body further having an outer body disposed between the connection body and the pin shaft, wherein the inner diameter of the screw hole is smaller than the diameter of the outer movement hole and the diameter of the outer body.

The support frame may further have an outer movement hole positioned outside the screw and inclined inward toward the center, the shaft body further having an outer body disposed between the connection body and the pin shaft and inclined inward toward the center, wherein the inner diameter of the screw hole is smaller than the diameter of the outer movement hole and the minimum diameter of the outer body.

The length of the connection body may be greater than the length of the screw hole.

The support frame may have a ring-shaped base; and a support rod installed on the upper surface of the base, the support rod in which the inner movement hole and the screw hole are formed.

In accordance with an exemplary embodiment of the present invention, an apparatus for processing substrate, the apparatus comprising: a reaction chamber; a substrate support for supporting a substrate to be processed in the reaction chamber; and a substrate support assembly capable of supporting the substrate to be processed to be lifted from the substrate support, wherein the substrate support assembly comprising: a support frame having at least one insertion hole recessed from one surface of the support frame, the insertion hole having an inner movement hole and a screw hole positioned outside the inner movement hole; and a substrate support member including a shaft body inserted into the insertion hole with one end of the shaft body and a pin shaft connected to the shaft body to support the substrate in contact, wherein the shaft body having an inner screw body inserted into the insertion hole and positioned in the inner movement hole and a connection body disposed between the inner screw body and the pin shaft and positioned in the screw hole, wherein the inner diameter of the screw hole is smaller than the diameter of the inner movement hole and the outer diameter of the inner screw body, the inner screw body is capable of passing through the screw hole by rotation.

Advantageous Effects

According to an embodiment of the present invention, the inner screw body of the substrate support member is located in the inner movement hole and the connection body of the substrate support member is located in the screw hole, it is possible to prevent the lift pin or the substrate support member from being separated from the base due to vibration, etc.

BEST MODE

Hereinafter, preferred embodiments of the present invention will be described in more detail with reference to FIGS. 1 to 8. The present invention may be embodied in different forms and should not be constructed as limited to the embodiments set forth herein. Rather, the embodiments are provided to explain the present invention more completely to those skilled in the art to which the present invention pertains. Therefore, the dimensions of each component shown in the figures are exaggerated for clarity of description.

Figure 1:
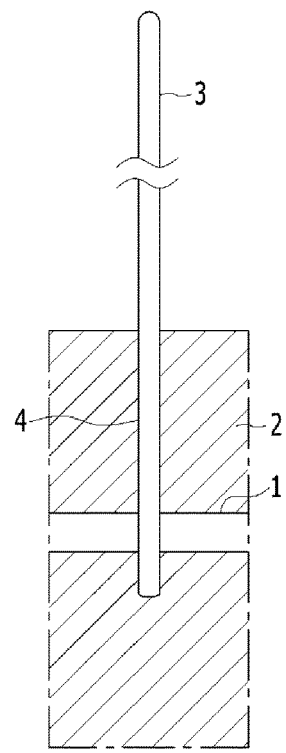
FIGS. 1 and 2 show the structure of a conventional substrate support assembly.
Figure 2:
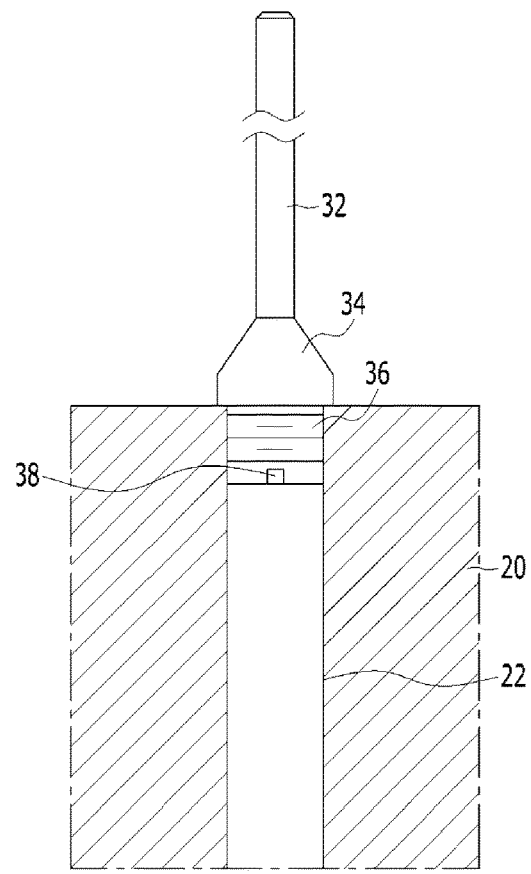

FIGS. 1 and 2 show the structure of a conventional substrate support assembly. As shown in FIG. 1, the substrate support assembly includes a support frame 2 and a substrate support member (or lift pin) 3. The support frame 2 has an insertion hole 4 formed in a vertical direction, and the substrate support member 3 is inserted into the insertion hole 4. The support frame 2 has a through hole 1 formed in a horizontal direction, and the through hole 1 communicates with the insertion hole 4. The operator inserts the substrate support member 3 into the insertion hole 4 and then inserts a fixture (not shown) into the through hole 1 to press the substrate support member 3 located on the through hole 1, so that the substrate support 3 can be fixed.

In addition, as shown in FIG. 2, the substrate support assembly includes a support frame 20 and a substrate support member (or lift pin). The support frame 20 has an insertion hole 22 formed in a vertical direction, and a thread is formed on the inner circumferential surface of the insertion hole 22. The substrate support member is provided with a pin shaft 32, a support body 34, and a screw body 36, and the screw body 36 is inserted into the insertion hole 22 by screwing. The operator inserts a tool (for example, a driver) into the insertion hole 22 through the lower portion of the insertion hole 22, and the tools is coupled to the tool groove 38 formed on the lower portion of the screw body 36, and then the operator rotates the screw body 36 so that the pin shaft 32 is fixed to the support frame 20.

However, all of the above-described methods are vulnerable to vibration generated during the elevating or lowering process of the support frame, therefore the screw joint is released and the substrate support member is separated from the support frame. Also, due to the different height of the substrate support members cause problems such as tilting of the substrate.

Figure 3:
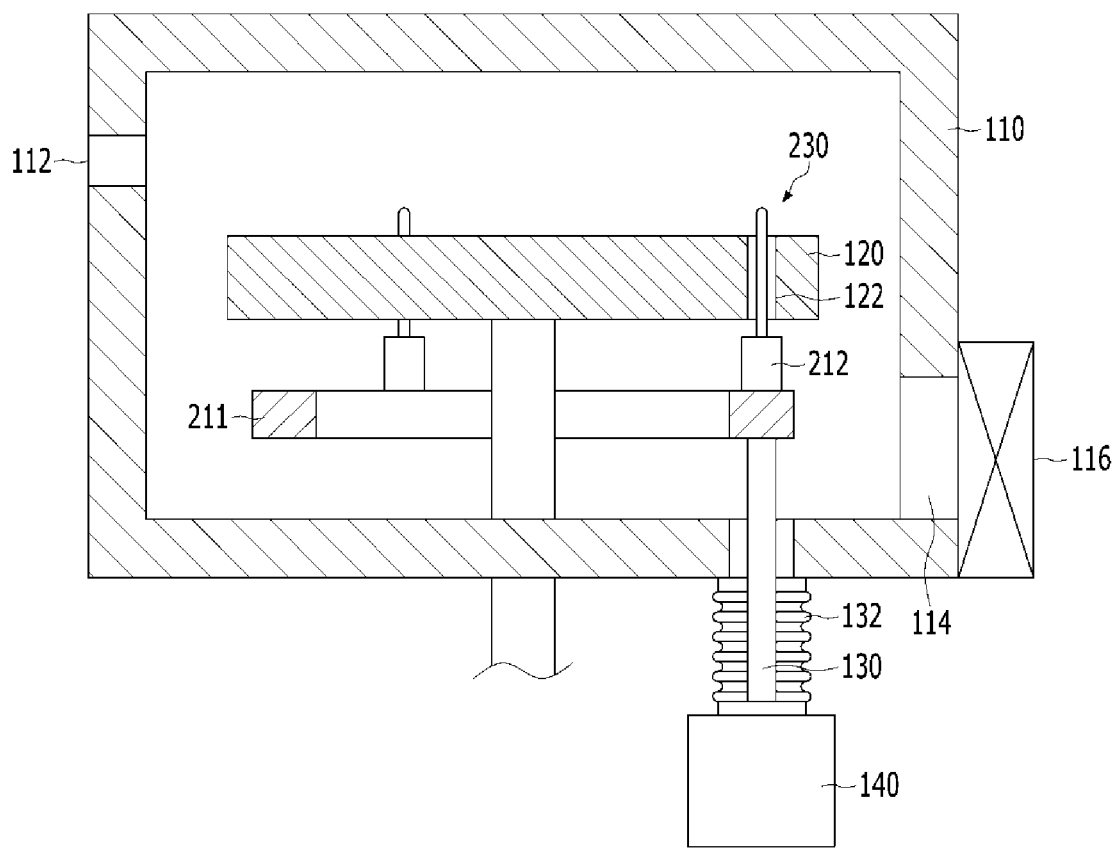
FIG. 3 shows a substrate processing apparatus according to an embodiment of the present invention.
Figure 4:
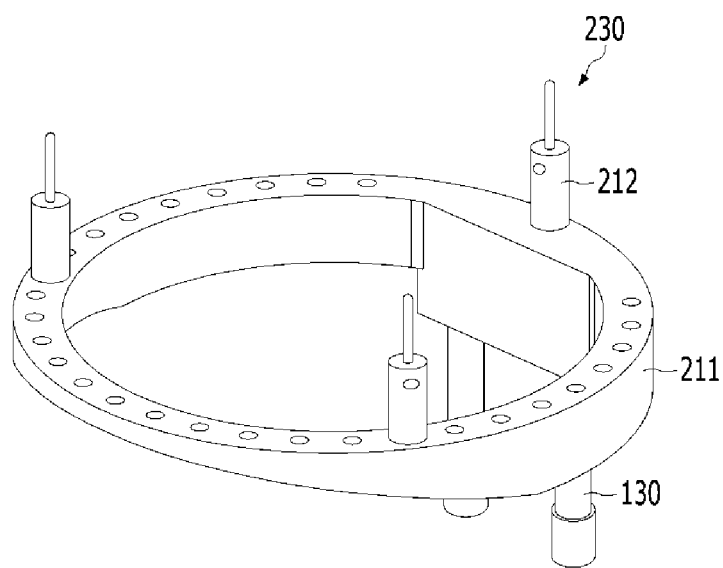
FIG. 4 shows the base and the support rod and the substrate support member shown in FIG. 3.

FIG. 3 shows a substrate processing apparatus according to an embodiment of the present invention, FIG. 4 shows the base and the support rod and the substrate support member shown in FIG. 3. The substrate processing apparatus includes a reaction chamber 110, a substrate support 120, and a substrate support assembly.

The reaction chamber 110 has a passage 112 formed on a side surface thereof, and a substrate to be processed (not shown) is placed on the substrate support 120 after moving into the reaction chamber 110 through the passage 112. The substrate may be processed variously in the reaction chamber 110, for example, the substrate may be etched or a thin film may be formed on the substrate. In this process, a shower head (not shown), a power supply (not shown), a gas supply (not shown), etc. may be installed inside or outside the reaction chamber 110. Further, the reaction chamber 110 has an exhaust port 114 formed on the side surface thereof, and the exhaust pump 116 is installed in the exhaust port 114. During the aforementioned process, the by-products or unreacted gas formed in the reaction chamber 110 may be discharged through the exhaust port 114 using the exhaust pump 116. The reaction chamber 110 may have various shapes such as a cylindrical shape or a hexahedral shape.

The substrate support 120 is disposed in the reaction chamber 110. For example, the substrate support 120 may have a rectangular plate or disk shape. The substrate support 120 may include a heater for heating the substrate, and may include an electrostatic chuck for fixing the substrate. The substrate support 120 has a plurality of guide holes 122, and the substrate support member 230 may be raised to protrude upward from the substrate support 120 and lowered through the guide hole 122.

The substrate support assembly includes a support frame and a substrate support member 230. The support frame is installed under the substrate support 120, and the lifting shaft 130 is connected to the support frame through the bottom wall of the reaction chamber 110. The lifting shaft 130 is connected to the actuator 140 so as to be able to move up and down together with the support frame, and the substrate support member 230 is installed on the support frame to lift the substrate while moving up and down together with the support frame. The bellows 132 may be installed on the lifting shaft 130 to seal an inner space of the reaction chamber 110.

Specifically, the substrate moves into the reaction chamber 110 through the passage 112 and is placed on the substrate support member 230 while the substrate support member 230 is raised. Thereafter, when the substrate support member 230 is lowered, the substrate is placed on the upper surface of the substrate support 120, and the aforementioned process is performed. When the process is completed, the actuator 140 is driven to raise the substrate support member 230, and the substrate is separated from the substrate support 120. Thereafter, the substrate is withdrawn from the reaction chamber 110 by the robot arm.

On the other hand, unlike previously described, the substrate support member 230 maintains a fixed state in the reaction chamber 110, and the actuator 140 moves the substrate support 120 up and down to place the substrate on the substrate support 120 or be separated from the substrate support 120. The actuator 140 may be a pneumatic cylinder, a hydraulic cylinder, a lead screw, a solenoid, a step motor, or the like.

The support frame includes a base 211 and a support rod 212. The base 211 has a ring shape, and the support rod 212 is fixed to the upper surface of the base 211. The substrate support member 230 is inserted and installed in the support rod 212. As described above, as the substrate support member 230 (or the substrate support 120) is raised or lowered, due to vibration applied to the substrate support member 230, the substrate support member 230 can be separated from the support rod 212.

Figure 5:
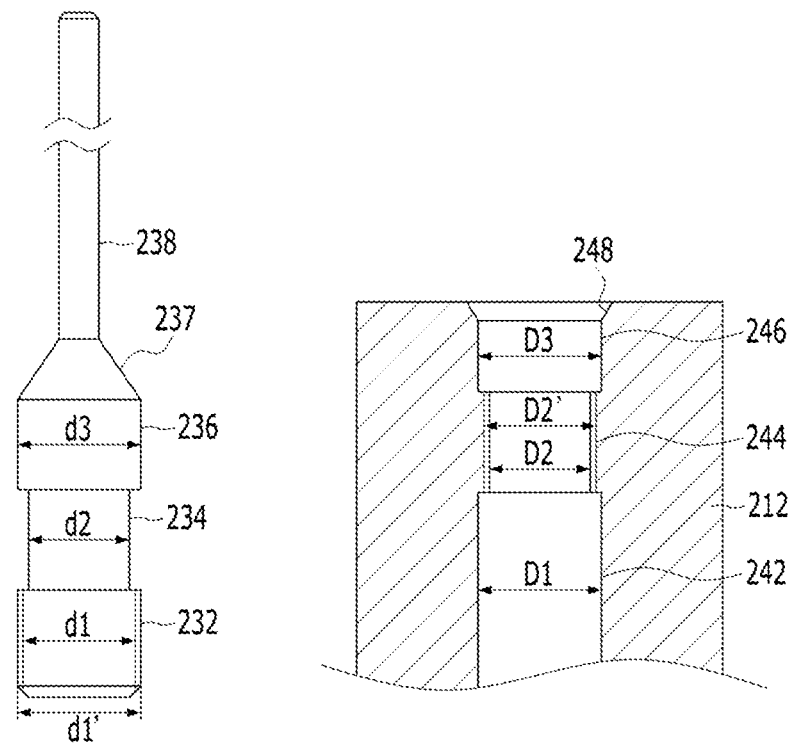
FIG. 5 shows an embodiment of the substrate support member and the support rod shown in FIG. 4.
Figure 6:
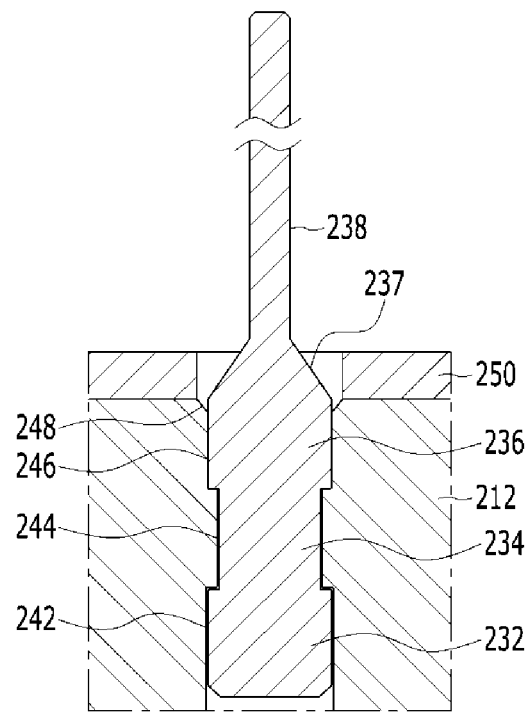
FIG. 6 shows the substrate support member of FIG. 5 which is installed on a support rod.

FIG. 5 shows an embodiment of the substrate support and the support rod shown in FIG. 4. FIG. 6 shows the substrate support of FIG. 5 which is installed on a support rod. First, as shown in FIG. 5, the support rod 212 has an insertion hole recessed from one surface along one direction. The insertion hole may extend to the inside of the support rod 212 or may be formed through the support rod 212. In the insertion hole, the inner movement hole 242, the screw hole 244, the outer movement hole 246, and the inclined hole 248 are sequentially arranged and separated from the inside to the outside.

The substrate support member 230 includes a shaft body and a pin shaft 238, and the shaft body includes an inner screw body 232, a connection body 234, an outer body 236, and a shaft body member 237. The shaft body is a part that is inserted into the insertion hole, and the pin shaft 238 is a part that contacts and supports the substrate.

A process of inserting and installing the shaft body of the substrate support member 230 into the insertion hole of the support rod 212 will be described as follows.

First, the screw hole 244 has a thread formed on the inner circumferential surface, the inner screw body 232 has a thread formed on the outer circumferential surface, and both threads correspond to each other. Therefore, when the operator rotates in one direction while inserting the inner screw body 232 into the outer movement hole 246, the inner screw body 232 starts screwing with the screw hole 244 to move toward the inner movement hole 242, and as shown in FIG. 6, after passing through the screw hole 244, the inner screw body 232 may be located in the inner movement hole 242. At this time, the screwing of the inner screw body 232 and the screw hole 244 is released.

Since the inner movement hole 242 has no thread and has a smooth inner circumferential surface, the inner screw body 232 is placed in a free state on the inner movement hole 242. Likewise, the connection body 234 and the outer body 236 are placed in a free state in the screw hole 244 and the outer movement hole 246, respectively.

More specifically, the thread has a major diameter and a minor diameter, the major diameter means the diameter of the crest in the male screw or the diameter of the root in the female screw, and the minor diameter means the diameter of the root in the male screw or the diameter of the crest in the female screw. Since the major diameter d1' of the inner screw body 232 is smaller than the diameter D3 of the outer movement hole 246, the inner screw body 232 is placed in a free state while being inserted into the outer movement hole 246.

As described above, when the inner screw body 232 passes through the screw hole 244, the screw connection of the inner screw body 232 and the screw hole 244 is released by the inner screw body 232's weight. Since the major diameter d1' of the inner screw body 232 is smaller than the diameter D1 of the inner movement hole 242, the inner screw body 232 is placed in a free state while being inserted into the inner movement hole 242.

Meanwhile, as described above, the inner screw body 232 and the screw hole 244 are not only unscrewed by the inner screw body 232's weight, but also the inner screw body 232 is separated from the screw hole 244 by the inner screw body 232's weight, so that the substrate support 120 cannot be separated from the support rod 212 due to vibration or the like. That is, the substrate support 120 cannot be separated from the support rod 212 because the inner screw body 232 and the screw hole 244 cannot be screwed without the intention of the operator.

In other words, since the minor diameter D2 of the screw hole 244 is smaller than the diameter D1 of the inner movement hole 242 and the major diameter d1' of the inner screw body 232, the substrate support 120 cannot be separated from the insertion hole of the rod 212. In addition, since the minor diameter (D2) of the screw hole 244 is smaller than the diameter d3 of the outer body 236, it is possible to limit the further insertion of the substrate support member 230 by the outer body 236.

In addition, the connection body 234 has a length greater than that of the screw hole 244, and the diameter of the connection body 234 is smaller than the valley diameter (D2) of the screw hole 244. Accordingly, the connection body 234 is placed in a free state in the screw hole 244. In addition, since the diameter d3 of the outer body 236 is smaller than the diameter D3 of the outer movement hole 246, the outer body 236 is placed in a free state in the outer movement hole 246.

On the other hand, the inclined hole 248 extends from the top of the outer movement hole 246 upwardly and being inclined to the outside, and guides the substrate support member 230 into the insertion hole.

Figure 7:
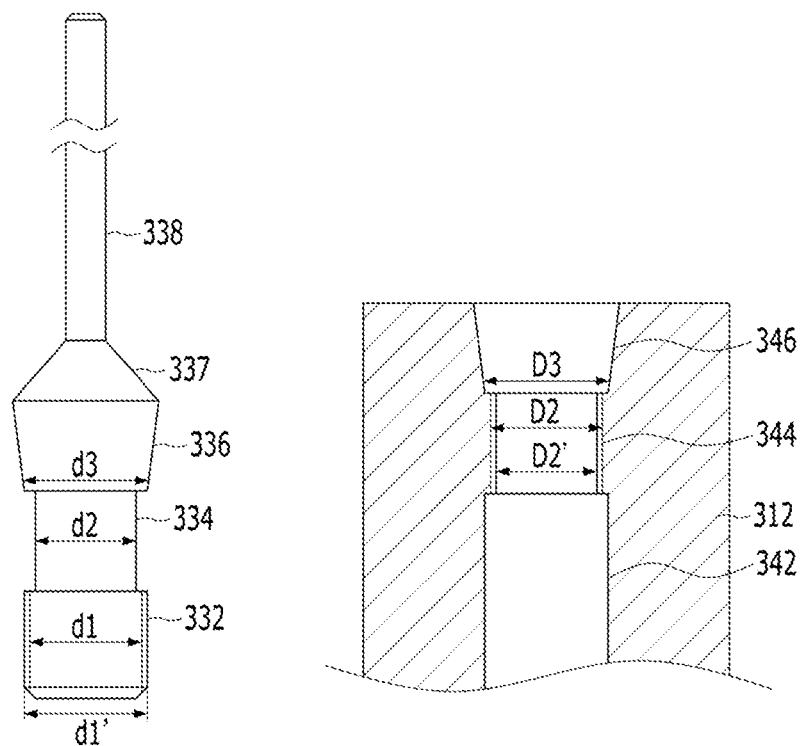
FIG. 7 shows another embodiment of the substrate support member and the support rod shown in FIG. 4.
Figure 8:
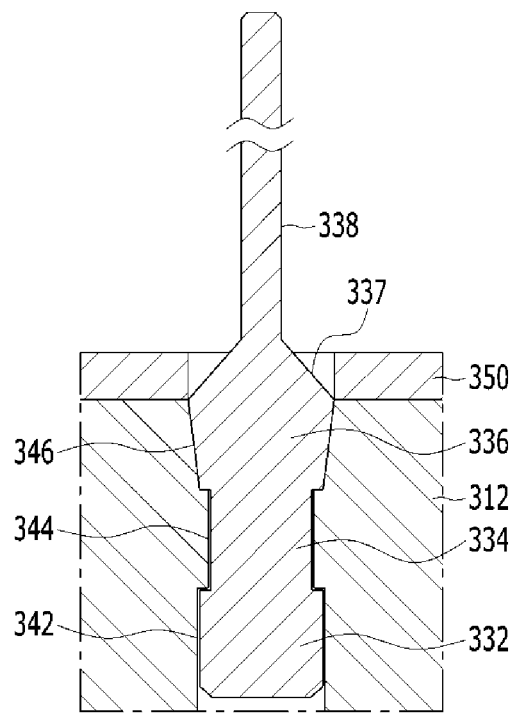
FIG. 8 shows the substrate support member of FIG. 7 which is installed on a support rod.

FIG. 7 shows another embodiment of the substrate support and the support rod shown in FIG. 4. and FIG. 8 shows the substrate support of FIG. 7 which is installed on a support rod. Hereinafter, only a configuration different from the above-described contents will be described, and the above-described contents may be equally applied to the following.

The outer movement hole 346 has a minimum diameter (D3), and has a shape inclined outward in the opposite direction to the screw hole 344. Similarly, the outer body 336 has a minimum diameter (d3), and has a shape inclined outward in the opposite direction to the connection body 334. Both have shapes corresponding to each other, and unlike the above-described embodiment, the inclined hole 248 may be omitted.

Since the major diameter (d1') of the inner screw body 332 is smaller than the minimum diameter (D3) of the outer movement hole 346, the inner screw body 332 is inserted into the outer movement hole 346 and be placed in a free state. In addition, since the minimum diameter (D3) of the outer body 336 is smaller than the minimum diameter of the outer movement hole 346, the outer body 336 is placed in a free state in the outer movement hole 346.

Although the present invention is described in detail with reference to the exemplary embodiments, the invention may be embodied in many different forms. Thus, technical idea and scope of claims set forth below are not limited to the preferred embodiments.

INDUSTRIAL APPLICABILITY

The present invention may be applicable to a various apparatus for manufacturing semiconductor or a various method for manufacturing semiconductor.

What is claimed is:

1. An assembly for supporting a substrate, the assembly comprising:
   a support frame having at least one insertion hole, the insertion hole having an inner movement hole, a screw hole positioned outside the inner movement hole, and an outer movement hole positioned outside the screw hole; and
   a substrate support member including a shaft body and a pin shaft connected to the shaft body to support the substrate in contact, wherein the shaft body has an inner screw body inserted into the insertion hole and positioned in the inner movement hole, a connection body disposed between the inner screw body and the pin shaft and positioned in the screw hole, and an outer body disposed between the connection body and the pin shaft and positioned in the outer movement hole,
   wherein an inner diameter of the screw hole is smaller than a diameter of the inner movement hole and an outer diameter of the inner screw body, and the inner screw body is capable of passing through the screw hole by rotation, wherein the inner diameter of the screw hole is smaller than a diameter of the outer movement hole and a diameter of the outer body, and wherein the insertion hole is recessed from one surface of the support frame, and one end of the shaft body is capable of being inserted into the insertion hole through an entrance of the insertion hole.

2. The assembly according to claim 1, wherein a length of the connection body is greater than a length of the screw hole.

3. The assembly according to claim 1, wherein the support frame has:
a ring-shaped base; and
a support rod installed on an upper surface of the base, the inner movement hole and the screw hole being formed in the support rod.

4. An assembly for supporting a substrate, the assembly comprising:
a support frame having at least one insertion hole, the insertion hole having an inner movement hole, a screw hole positioned outside the inner movement hole, and an outer movement hole positioned outside the screw hole; and
a substrate support member including a shaft body and a pin shaft connected to the shaft body to support the substrate in contact, wherein the shaft body has an inner screw body inserted into the insertion hole and positioned in the inner movement hole, a connection body disposed between the inner screw body and the pin shaft and positioned in the screw hole, and an outer body disposed between the connection body and the pin shaft and positioned in the outer movement hole,
wherein an inner diameter of the screw hole is smaller than a diameter of the inner movement hole and an outer diameter of the inner screw body, and the inner screw body is capable of passing through the screw hole by rotation,
wherein the inner diameter of the screw hole is smaller than a diameter of the outer movement hole and a minimum diameter of the outer body,
wherein the insertion hole is recessed from one surface of the support frame, and one end of the shaft body is capable of being inserted into the insertion hole through an entrance of the insertion hole, and
wherein the outer movement hole is inclined inward toward a center and the outer body is inclined inward toward the center.

5. The assembly according to claim 4, wherein a length of the connection body is greater than a length of the screw hole.

6. The assembly according to claim 4, wherein the support frame has:
a ring-shaped base; and
a support rod installed on an upper surface of the base, the inner movement hole and the screw hole being formed in the support rod.

7. An apparatus for processing a substrate, the apparatus comprising:
a reaction chamber;
a substrate support for supporting the substrate to be processed in the reaction chamber; and
a substrate support assembly capable of supporting the substrate to be processed to be lifted from the substrate support,
wherein the substrate support assembly comprises:
a support frame having at least one insertion hole, the insertion hole having an inner movement hole, a screw hole positioned outside the inner movement hole, and an outer movement hole positioned outside the screw hole; and
a substrate support member including a shaft body and a pin shaft connected to the shaft body to support the substrate in contact, wherein the shaft body has an inner screw body inserted into the insertion hole and positioned in the inner movement hole, a connection body disposed between the inner screw body and the pin shaft and positioned in the screw hole, and an outer body disposed between the connection body and the pin shaft and positioned in the outer movement hole,
wherein an inner diameter of the screw hole is smaller than a diameter of the inner movement hole and an outer diameter of the inner screw body, and the inner screw body is capable of passing through the screw hole by rotation,
wherein the inner diameter of the screw hole is smaller than a diameter of the outer movement hole and a diameter of the outer body, and
wherein the insertion hole is recessed from one surface of the support frame, and one end of the shaft body is capable of being inserted into the insertion hole through an entrance of the insertion hole.

8. An apparatus for processing a substrate, the apparatus comprising:
a reaction chamber;
a substrate support for supporting the substrate to be processed in the reaction chamber; and
a substrate support assembly capable of supporting the substrate to be processed to be lifted from the substrate support,
wherein the substrate support assembly comprises:
a support frame having at least one insertion hole, the insertion hole having an inner movement hole, a screw hole positioned outside the inner movement hole, and an outer movement hole positioned outside the screw hole; and
a substrate support member including a shaft body and a pin shaft connected to the shaft body to support the substrate in contact, wherein the shaft body has an inner screw body inserted into the insertion hole and positioned in the inner movement hole, a connection body disposed between the inner screw body and the pin shaft and positioned in the screw hole, and an outer body disposed between the connection body and the pin shaft and positioned in the outer movement hole,
wherein an inner diameter of the screw hole is smaller than a diameter of the inner movement hole and an outer diameter of the inner screw body, and the inner screw body is capable of passing through the screw hole by rotation,
wherein the inner diameter of the screw hole is smaller than a diameter of the outer movement hole and a minimum diameter of the outer body,
wherein the insertion hole is recessed from one surface of the support frame, and one end of the shaft body is capable of being inserted into the insertion hole through an entrance of the insertion hole, and
wherein the outer movement hole is inclined inward toward a center and the outer body is inclined inward toward the center.

* * * * *